United States Patent
Lin et al.

(10) Patent No.: US 7,416,607 B2
(45) Date of Patent: Aug. 26, 2008

(54) FLUID INJECTION APPARATUS FOR SEMICONDUCTOR PROCESSING

(75) Inventors: Kun-Tzu Lin, Tainan (TW); Cha-Hong Chung, Shanhua Township, Tainan County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 318 days.

(21) Appl. No.: 11/138,845

(22) Filed: May 25, 2005

(65) Prior Publication Data

US 2006/0269686 A1    Nov. 30, 2006

(51) Int. Cl.
*B05B 3/00*  (2006.01)
*B05B 3/10*  (2006.01)
*B05B 1/34*  (2006.01)

(52) U.S. Cl. .................. 118/323; 118/321; 239/223; 239/477

(58) Field of Classification Search ............. 118/323, 118/300, 321, 700–703; 239/223, 224, 220, 239/381, DIG. 11, 382–383, 389, 476, 477; 427/427.3

See application file for complete search history.

(56) References Cited

U.S. PATENT DOCUMENTS

| | | | | |
|---|---|---|---|---|
| 2,103,887 A | * | 12/1937 | Bowen et al. | 366/132 |
| 5,368,234 A | * | 11/1994 | Foster et al. | 239/333 |
| 5,584,435 A | * | 12/1996 | Lind | 239/73 |
| 2004/0140378 A1 | * | 7/2004 | Merabet | 239/700 |
| 2005/0172892 A1 | * | 8/2005 | Thome et al. | 118/323 |

* cited by examiner

*Primary Examiner*—Yewebdar T Tadesse
(74) *Attorney, Agent, or Firm*—Tung & Associates

(57) ABSTRACT

A fluid injection apparatus for discharging a fluid against a surface in a controlled manner is disclosed. The fluid injection apparatus includes at least one fluid supply conduit, at least one rotatable and vertically-movable fluid injector provided in fluid communication with the fluid supply conduit and at least one fluid conduit provided in the fluid injector. By selective vertical movement of the fluid injector, each fluid conduit in the fluid injector can be selectively blocked from or provided in fluid communication with the fluid supply conduit to impart a desired flow configuration of a processing fluid against the surface. By selective rotational movement of the fluid injector, a rotational or swirling motion can be imparted to the fluid as it contacts the surface.

22 Claims, 9 Drawing Sheets

FLUID INJECTION APPARATUS FOR SEMICONDUCTOR PROCESSING

FIELD OF THE INVENTION

The present invention relates to apparatus used in the fabrication of semiconductors. More particularly, the present invention relates to a fluid injection apparatus, which facilitates the flow of processing fluids against a wafer surface in various flow and distribution patterns.

BACKGROUND OF THE INVENTION

In the fabrication of semiconductor integrated circuits, metal conductor lines are used to interconnect the multiple components in device circuits on a semiconductor wafer. A general process used in the deposition of metal conductor line patterns on semiconductor wafers includes deposition of a conducting layer on the silicon wafer substrate; formation of a photoresist or other mask such as titanium oxide or silicon oxide, in the form of the desired metal conductor line pattern, using standard lithographic techniques; subjecting the wafer substrate to a dry etching process to remove the conducting layer from the areas not covered by the mask, thereby leaving the metal layer in the form of the masked conductor line pattern; and removing the mask layer typically using reactive plasma and chlorine gas, thereby exposing the top surface of the metal conductor lines. Typically, multiple alternating layers of electrically conductive and insulative materials are sequentially deposited on the wafer substrate, and conductive layers at different levels on the wafer may be electrically connected to each other by etching vias, or openings, in the insulative layers and filling the vias using aluminum, tungsten or other metal to establish electrical connection between the conductive layers.

Normally in etchers and other semiconductor processing tools such as those used for the deposition of thin films on wafers, gases in the form of chemicals or fluids are injected or flowed towards the wafer surface for etching or deposition purposes. The direction of flow and distribution of the fluid on the wafer surface influences the etching rate or deposition rate, as well as the CD (critical dimension) uniformity or film thickness uniformity. Conventional processing tools use a fixed-type fluid injector or plate which provides flow of the fluid against the wafer in a fixed direction or distribution pattern. Therefore, under circumstances in which there exists a need to adjust the flow and distribution of the fluid on the wafer surface for purposes of etching or deposition uniformity, such tools are unsuitable. Therefore, a new and improved fluid injection apparatus is needed to facilitate flow of processing fluids against a wafer surface in various flow and distribution patterns depending on the particular processing requirements.

SUMMARY OF THE INVENTION

The present invention is generally directed towards a fluid injection apparatus for discharging a fluid against a surface in a positionally-controlled and directionally-controlled manner. The fluid injection apparatus includes at least one fluid supply conduit, at least one rotatable and vertically-movable fluid injector provided in fluid communication with the fluid supply conduit and at least one fluid conduit provided in the fluid injector. By selective vertical movement of the fluid injector, each fluid conduit in the fluid injector can be selectively blocked from or provided in fluid communication with the fluid supply conduit to impart a desired flow configuration of a processing fluid against the surface. By selective rotational movement of the fluid injector, a rotational or swirling motion can be imparted to the fluid as it contacts the surface.

BRIEF DESCRIPTION OF THE DRAWINGS

The invention will now be described, by way of example, with reference to the accompanying drawings, in which.

DETAILED DESCRIPTION OF THE INVENTION

Figure 1:
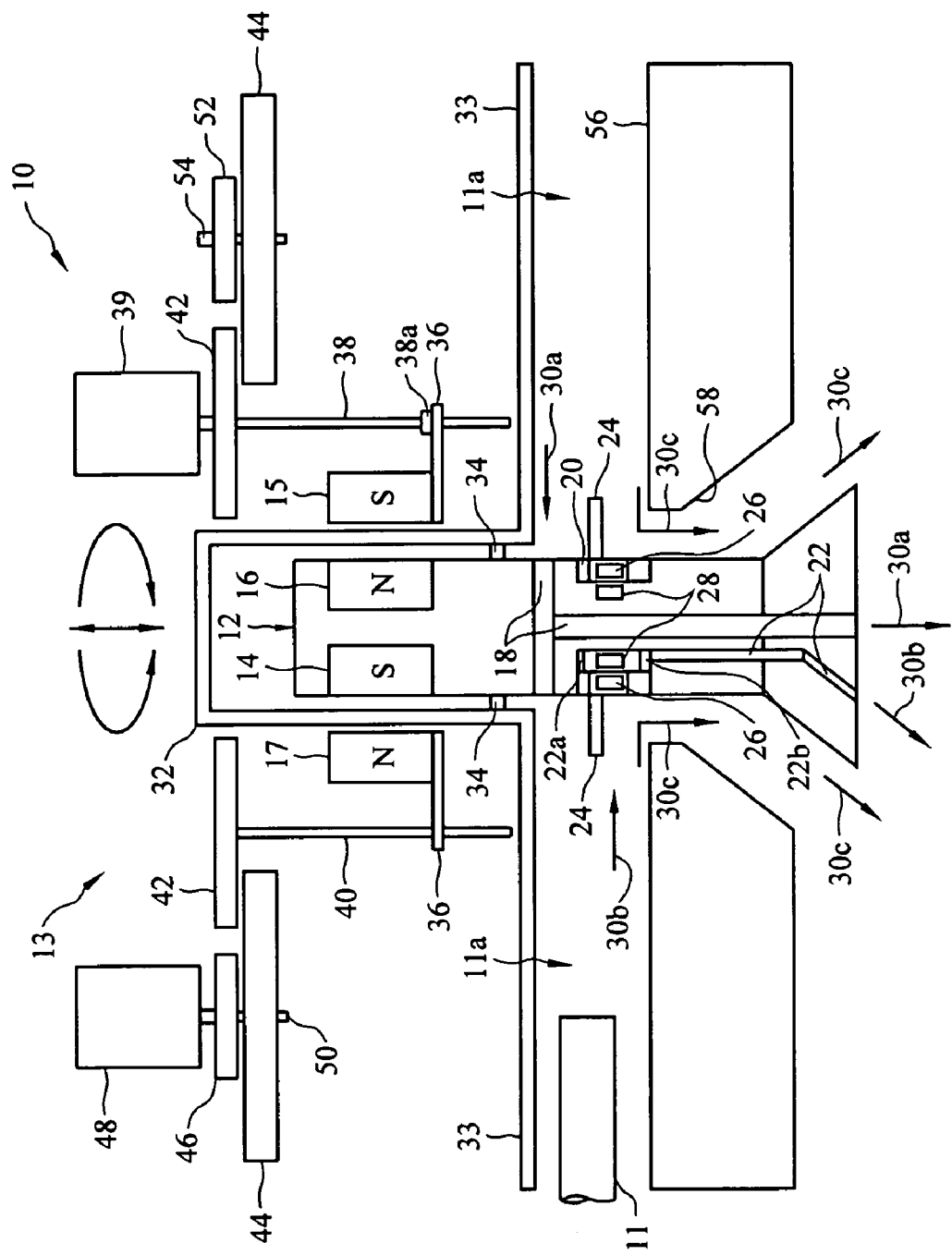
FIG. 1 is a schematic of a mechanically-actuated embodiment of the fluid injection apparatus of the present invention, illustrating control of the flow of a fluid from the apparatus by rotational and vertical positional adjustment of a fluid injector.

Referring initially to FIG. 1, an illustrative embodiment of a mechanically-actuated fluid injection apparatus, hereinafter apparatus, of the present invention is generally indicated by reference numeral 10. The apparatus 10 is suitable for dispensing a fluid 30, such as a processing liquid or gas used in semiconductor processing, for example, against the surface of a substrate (not shown) in a direction-controlled and position-controlled manner during the fabrication of integrated circuits on the substrate. The apparatus 10 may be installed, for example, in an etching chamber (not shown) for dispensing an etching fluid 30 against the wafer, or a chemical vapor deposition (CVD) chamber (not shown) for dispensing a deposition gas 30 against the wafer, for example. It is understood that the apparatus 10 may be used in other industrial applications in which it is desired to dispense a fluid against a substrate in a direction-controlled and position-controlled manner.

As shown in FIG. 1, the apparatus 10 includes a fluid injector 12 which is mounted for selective vertical movement inside an outer isolation cover 32 by operation of a magnetic coupling device 13. The bottom end of the fluid injector 12 is typically flared outwardly. An isolation flange 34 extends inwardly from the outer isolation cover 32 and sealingly engages the outer surface of the fluid injector 12. The outer isolation cover 32 includes a fluid partition 33, which extends outwardly from the bottom end of the main portion of the outer isolation cover 32. A fluid supply conduit 11 is provided in a fluid flow space 11a beneath the fluid partition 33 to supply a stream of the processing fluid 30 to the apparatus 10.

The fluid injector 12 is typically cylindrical and includes an inner magnet 14 and an inner magnet 16 which are of opposite polarity and disposed at opposite or diametrically-opposed sides or edges of the fluid injector 12. A "T" shaped central fluid conduit 18 extends through the fluid injector 12, beneath the inner magnets 14, 16. The central fluid conduit 18 includes a horizontal segment which extends horizontally through the fluid injector 12 and a vertical segment which extends downwardly from the horizontal segment and opens at the flared bottom end of the fluid injector 12.

An annular plate cavity 20 is provided in the outer surface of the fluid injector 12 and encircles the vertical segment of the central fluid conduit 18. An annular stationary magnet 28 is provided in the fluid injector 12, inside and adjacent to the plate cavity 20. A floating isolation plate 24, which typically has an annular configuration, is mounted for vertical movement in the plate cavity 20. An annular floating magnet 26, having a magnetic polarity which is opposite that of the stationary magnet 28, is provided in the floating isolation plate 24. An outer fluid conduit 22 extends from the plate cavity 20, through the fluid injector 12 and opens at the flared bottom of the fluid injector 12. The discharge segment of the outer fluid conduit 22 is typically disposed at an angle with respect to the central fluid conduit 18 and may be generally parallel to the outwardly-flared contour of the bottom end of the fluid injector 12. The outer fluid conduit 22 has an upper inlet 22a and a lower inlet 22b which communicate with the plate cavity 20 and are provided at the upper and lower ends, respectively, of the stationary magnet 28.

Due to magnetic attraction between the stationary magnet 28 and the floating magnet 26, the floating isolation plate 24 is normally positioned at substantially the vertical center of the plate cavity 20, about equidistant between the upper inlet 22a and lower inlet 22b of the outer fluid conduit 22. Responsive to raising or lowering of the fluid injector 12 with respect to the outer isolation cover 32, however, the floating isolation plate 24 can be caused to block the upper inlet 22a or lower inlet 22b and prevent discharge of the fluid 30 from the outer fluid conduit 22, as will be hereinafter described.

An annular inner isolation plate 56 surrounds the fluid injector 12. The fluid injector 12 extends through a peripheral fluid conduit 58 which extends through the center of the inner isolation plate 56. The inside edge of the peripheral fluid conduit 58 is typically angled outwardly to generally correspond to the outwardly-flared shape of the bottom end of the fluid injector 12.

The magnetic coupling device 13 includes an annular fixed plate 44 which is mounted above the fluid partition 33. The fixed plate 44 encircles the outer isolation cover 32. A drive shaft 50 is journalled for rotation in the fixed plate 44, and a rotational drive motor 48 drivingly engages the drive shaft 50. A drive gear 46 is provided on the drive shaft 50. An annular gear plate 42 is rotatably mounted above the fixed plate 44 and meshes with the drive gear 46. A lead rod 40 extends downwardly from one side of the gear plate 42, and a moving plate 36 extends horizontally from the lead rod 40, beneath the gear plate 42. An outer magnet 17, which is disposed in magnetic proximity and is opposite in magnetic polarity to the inner magnet 14 on the fluid injector 12, is provided on the moving plate 36. A lead screw 38 extends downwardly through the opposite side of the gear plate 42 and is mounted in a bearing 38a provided on the moving plate 36. A vertical drive motor 39 drivingly engages the upper end of the lead screw 38. An outer magnet 15, which is disposed in magnetic proximity and opposite in magnetic polarity to the inner magnet 16, is provided on the moving plate 36. A gear shaft 54 is journalled for rotation on the fixed plate 44, typically in diametrically-opposed relationship to the drive gear 46. A holding gear 52 is mounted on the gear shaft 54 and meshes with the gear plate 42.

As shown in FIG. 1, vertical positional adjustment of the fluid injector 12 in the outer isolation cover 32 is selectively carried out by operation of the vertical drive motor 39. Accordingly, the vertical drive motor 39 rotates the lead screw 38, which causes the moving plate 36 to travel upwardly or downwardly on the lead screw 38, depending on the direction of rotation of the lead screw 38. This, in turn, raises or lowers the fluid injector 12 due to the magnetic attraction between the outer magnets 15, 17 and inner magnets 16, 14, respectively. Clockwise or counterclockwise rotation of the fluid injector 12 in the outer isolation cover 32 is selectively carried out by operation of the rotational drive motor 48. Accordingly, the rotational drive motor 48 rotates the drive gear 46 through the drive shaft 50. The drive gear 46, in turn, rotates the gear plate 42, causing the outer magnets 15, 17 on the moving plate 36 to rotate as they magnetically attract the respective inner magnets 16, 14 on the fluid injector 12, thus causing the fluid injector 12 to rotate in the same direction as the gear plate 42.

Figure 2:
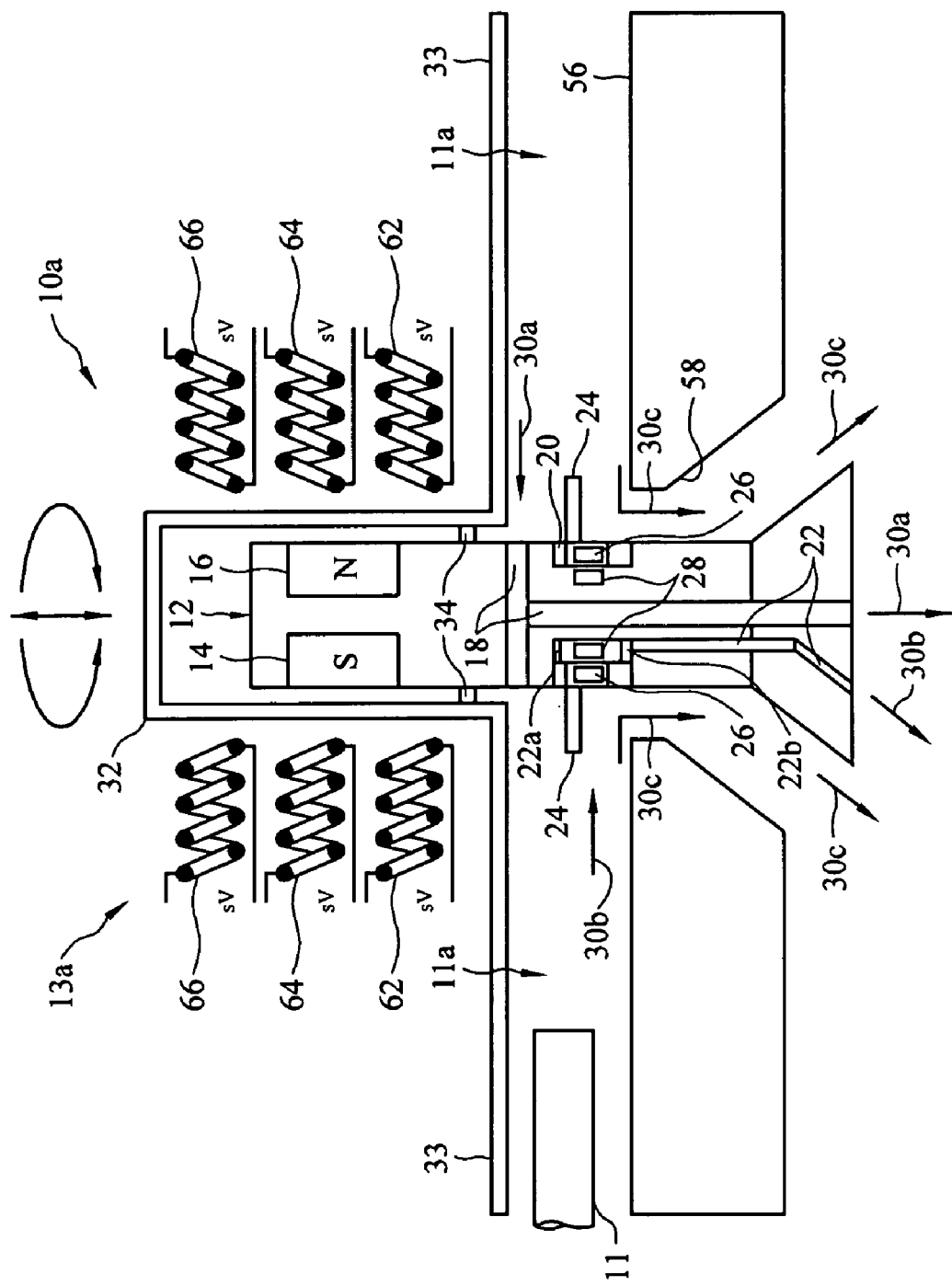
FIG. 2 is a schematic of an illustrative electrically-actuated embodiment of the fluid injection apparatus of the present invention.

Referring next to FIG. 2, an alternative, electrically-actuated embodiment of the fluid injection apparatus of the present invention is generally indicated by reference numeral 10a. The apparatus 10a includes a magnetic coupling device 13a which uses magnetic induction effects instead of the vertical drive motor 39 and rotational drive motor 48 heretofore described with respect to the apparatus 10 of FIG. 1 to facilitate vertical and rotational movement of the fluid injector 12. The apparatus 10a utilizes multiple sets of bottom electrical coils 62, middle electrical coils 64 and top electrical coils 66 which are provided around the outer isolation cover 32. Accordingly, by the selective distribution of electrical current through the bottom electrical coils 62, the middle electrical coils 64 and/or the top electrical coils 66, the fluid injector 12 can be selectively raised or lowered in the outer isolation cover 32 by magnetic attraction between the inner magnets 14, 16 and the energized electrical coils. In similar fashion, the fluid injector 12 can be selectively rotated in the outer isolation cover 32 by time-varying the distribution of electrical current through the electrical coils in a circular pattern around the outer isolation cover 32. While operation of the invention will be hereinafter described with respect to the apparatus 10, the apparatus 10a can be operated in similar fashion to accomplish the purposes of the invention.

Referring next to FIGS. 1 and 3-9, the fluid injection apparatus 10 is suitable to serve as a FDP (Fluid Distribution Plat) for semiconductor manufacturing. The fluid injection apparatus 10 is typically installed in a processing chamber (not shown) used in the fabrication of semiconductor devices on a semiconductor wafer (not shown). Accordingly, the outer isolation cover 32 and the fluid partition 33 sealingly separate the vacuum or low-pressure region of the chamber interior beneath the outer isolation cover 32 from the atmospheric pressure region above the outer isolation cover 32. The apparatus 10 can be operated to distribute a processing fluid 30, such as an etching gas or liquid or a film-forming gas or liquid, for example, in the fabrication of integrated circuits, from the fluid supply conduit 11 onto the surface of a semiconductor wafer (not shown), for example in a selected flow pattern. The fluid injector 12 can be raised, lowered and/or rotated in the outer isolation cover 32 to facilitate selective flow of the fluid 30 through the central fluid conduit 18, the outer fluid conduit 22 and/or the peripheral fluid conduit 58 in order to control the positional and directional flow characteristics of the fluid 30 on the surface of the wafer. This, in turn, facilitates uniform etching and/or deposition of films on the wafer surface. For purposes of discussion herein, the fluid 30 will be described as having a first portion 30a which flows through and is discharged from the central fluid conduit 18, a second portion 30b which flows through and is discharged from the outer fluid conduit 22, and a third portion 30c which flows through and is discharged from the peripheral fluid conduit 58.

In one possible application of the invention, the apparatus 10 is installed in a chemical vapor deposition (CVD) chamber (not shown) which is used to deposit a dielectric layer (not shown) on a wafer (not shown). Accordingly, the processing fluid 30, which is the gas containing the deposition components for formation of the dielectric layer, are distributed through the apparatus 10, via the central fluid conduit 18, outer fluid conduit 22 and/or peripheral fluid conduit 58, in a controlled flow pattern to impart uniformity to the dielectric layer.

FIG. 1 illustrates operation of the apparatus 10 to facilitate maximal flow of the fluid 30 onto the wafer. Accordingly, the first portion 30a of the fluid 30 initially flows through the central fluid conduit 18 and is then discharged in a substantially vertical path directly against the surface of the wafer from the bottom end of the fluid injector 12. Simultaneously, the second portion 30b of the fluid 30 flows into the plate cavity 20; through the upper inlet 22a and lower inlet 22b of the outer fluid conduit 22; and is discharged from the outer fluid conduit 22 at the bottom of the fluid injector 12, at an angle with respect to the flow path of the first portion 30a of the fluid 30. Therefore, the second portion 30b of the fluid 30 flows outwardly and strikes the surface of the wafer at an angle. The third portion 30c of the fluid 30 flows downwardly and outwardly through the peripheral fluid conduit 58 and strikes the wafer in an outwardly-angled, annular flow path.

Figure 3:
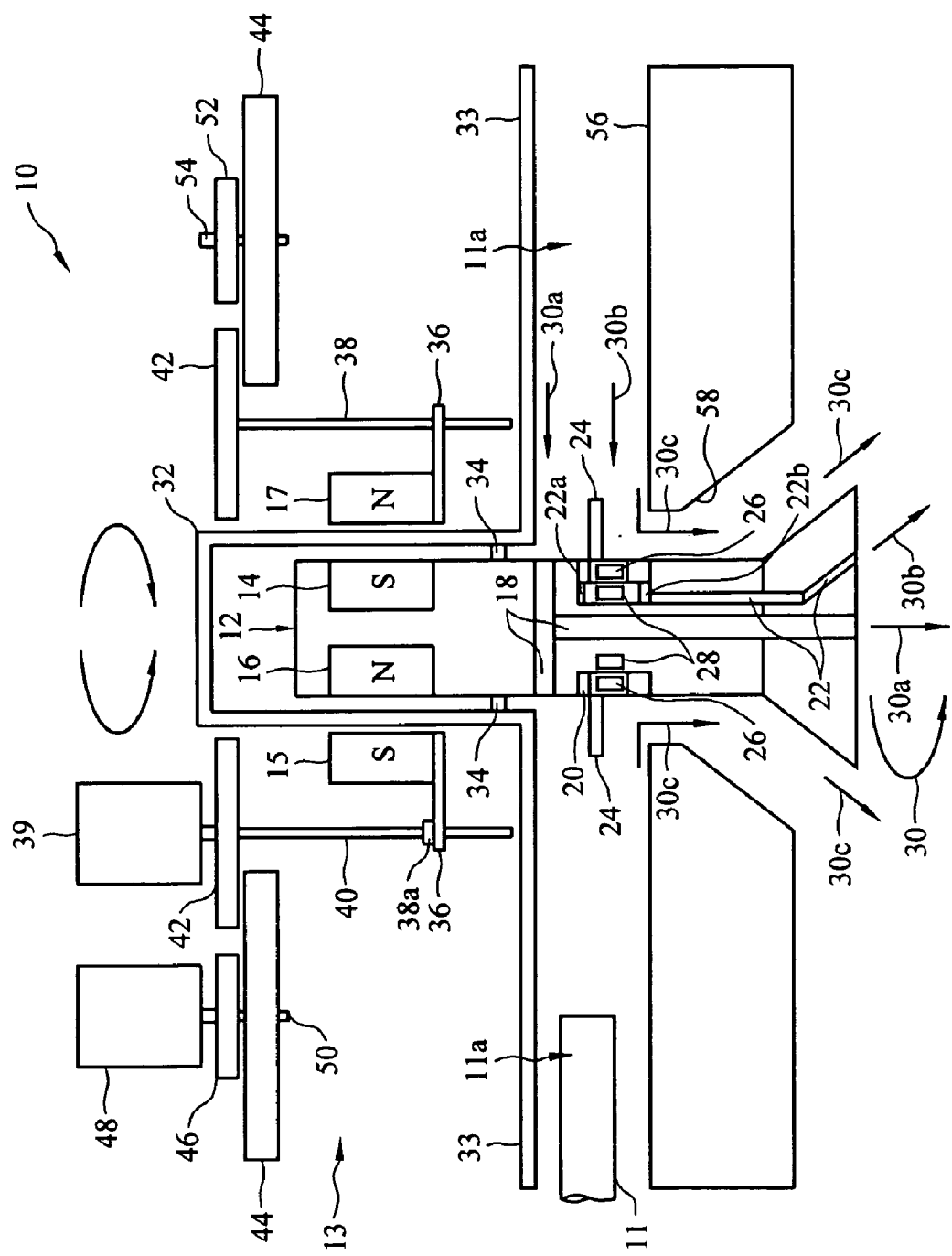
FIG. 3 is a schematic of the mechanically-actuated embodiment of the fluid injection apparatus, illustrating rotation of the fluid injector to facilitate swirling of a fluid as the fluid is dispensed from the fluid injector.

FIG. 3 illustrates operation of the apparatus 10 wherein the fluid injector 12 is rotated by operation of the rotational drive motor 48 as the first portion 30a of the fluid 30 is distributed through and discharged from the central fluid conduit 18 and the second portion 30b of the fluid 30 is distributed through and discharged from the outer fluid conduit 22. Accordingly, the first portion 30a strikes the surface of the wafer directly, whereas the second portion 30b is ejected from the outer fluid conduit 22 and strikes the surface of the wafer in a rotating or spiraling motion. The third portion 30c is typically ejected outwardly from the apparatus 10 through the peripheral fluid conduit 58 and strikes the surface of the wafer in an outwardly-angled, annular flow path.

Figure 4:
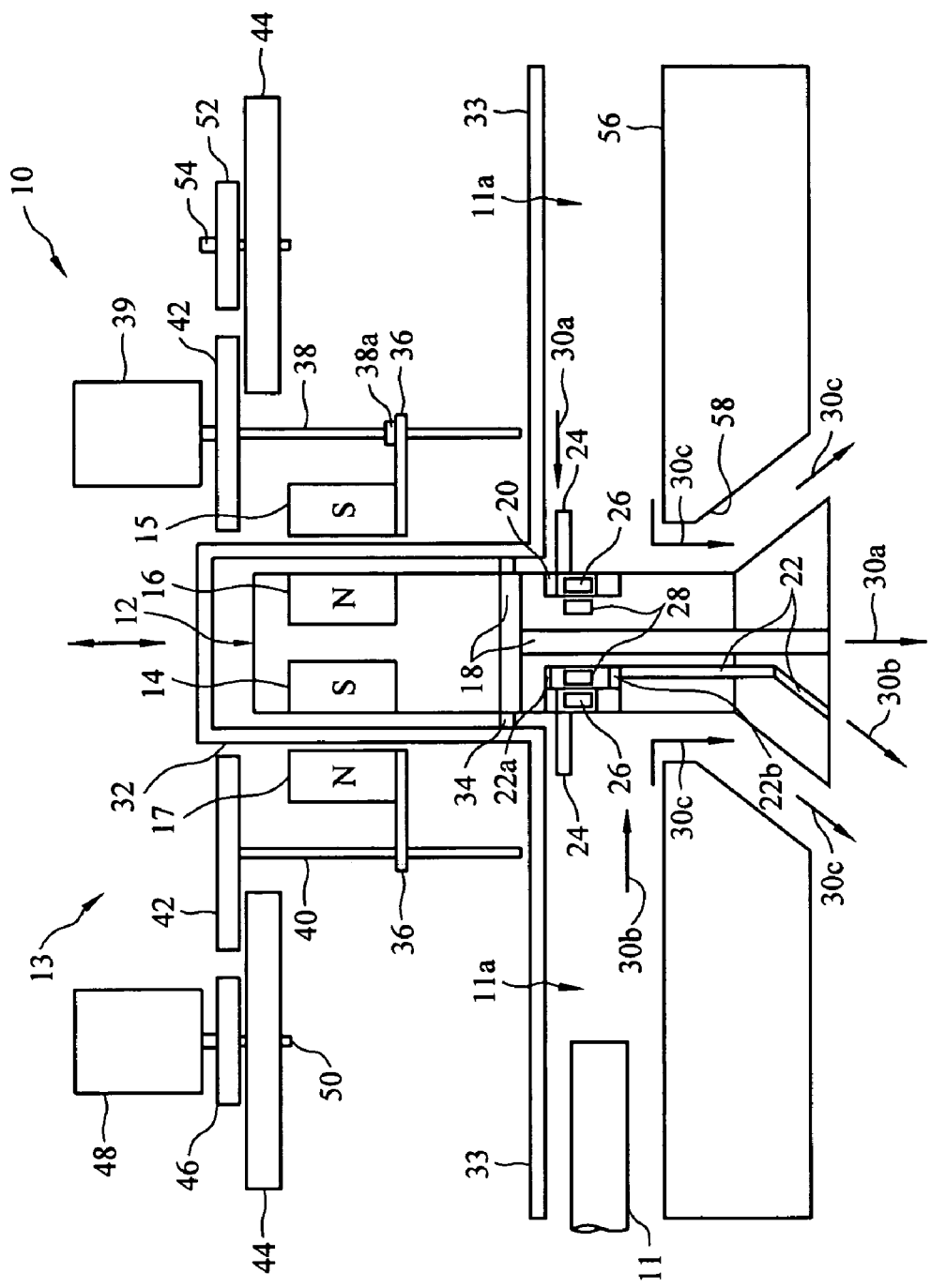
FIG. 4 is a schematic of the fluid injection apparatus, with the fluid injector located in a "high" position to facilitate wide fluid flow distribution.

FIG. 4 illustrates operation of the apparatus 10 wherein the fluid injector 12 is in an upper position in the outer isolation cover 32 and the floating isolation plate 24 is spaced from the inner isolation plate 56 across a relatively large gap. This facilitates flow of a relatively large quantity of the second portion 30b of the fluid 30 through the peripheral fluid conduit 58 and against the surface of the wafer in a wide, outwardly-angled annular flow path. Simultaneously, the central fluid conduit 18 is partially blocked by the outer isolation cover 32, thus partially restricting the quantity of the first portion 30a which flows through and is discharged from the central fluid conduit 18. The second portion 30b is ejected outwardly from the outer fluid conduit 22 and strikes the surface of the wafer at an angle. This results in widespread distribution of fluid flow across the surface of the wafer.

Figure 5:
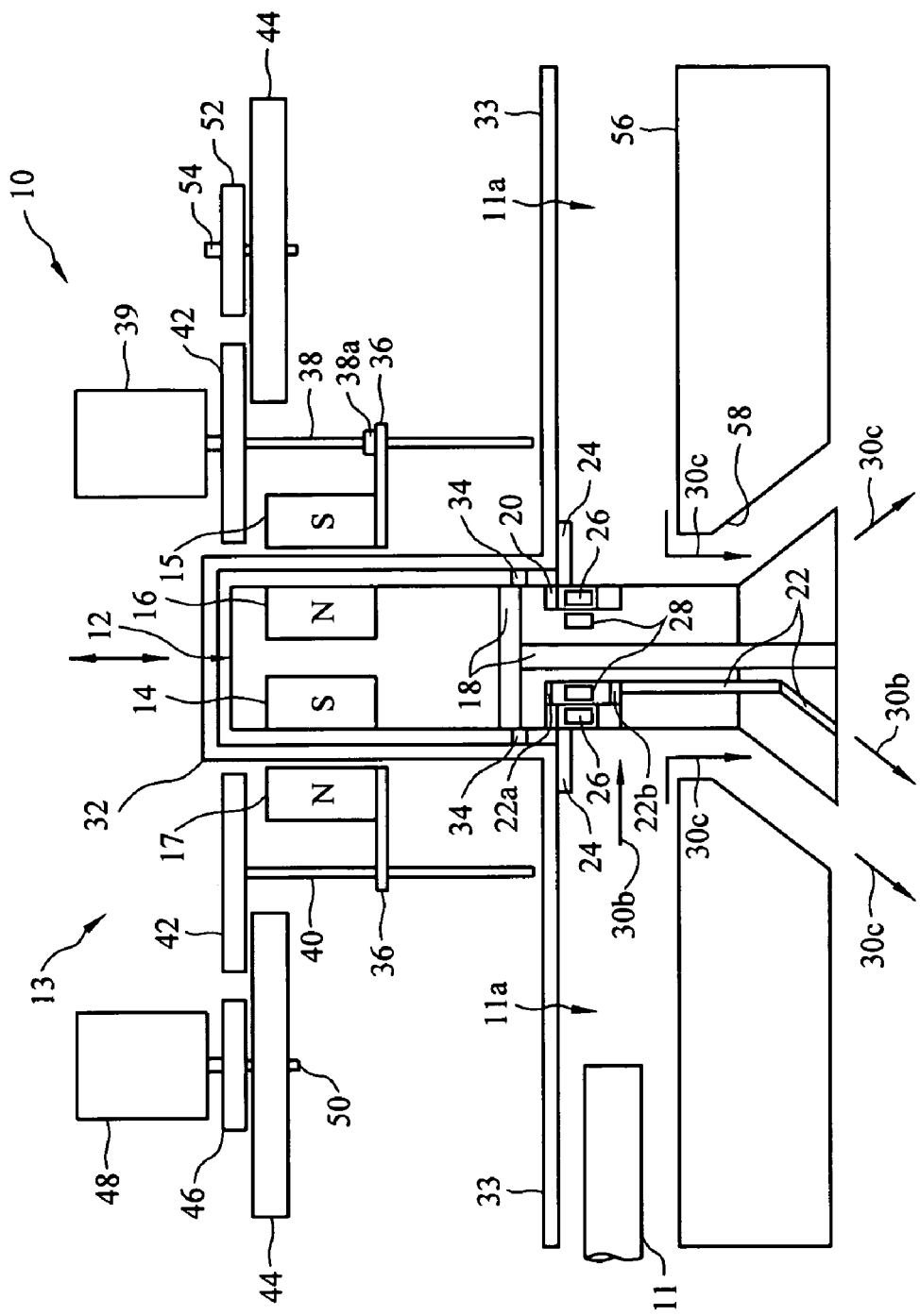
FIG. 5 is a schematic of the fluid injection apparatus, with the fluid injector positioned to block flow of fluid through a central fluid conduit in the fluid injector and facilitate peripheral flow of fluid from the apparatus.

FIG. 5 illustrates operation of the apparatus 10 wherein the fluid injector 10, as compared to its position in FIG. 4, is at a higher position in the outer isolation cover 32, such that the floating isolation plate 24 engages the bottom surface of the fluid partition 33 and the horizontal segment of the central fluid conduit 18 is located entirely inside the outer isolation cover 32. Accordingly, the first portion 30a of the fluid 30 is incapable of entering and being discharged from the central fluid conduit 18. Although the upper inlet 22a of the outer fluid conduit 22 is blocked by engagement of the floating isolation plate 24 against the fluid partition 33, the second portion 30b of the fluid 30 is still able to flow into and from the outer fluid conduit 22 through the plate cavity 20 and lower inlet 22b, respectively. Furthermore, due to the maximal width of the gap between the floating isolation plate 24 and the inner isolation plate 56, a relatively large quantity of the third portion 30c of the fluid 30 flows through the peripheral fluid conduit 58 and is ejected outwardly against the surface of the wafer in an annular flow path.

Figure 6:
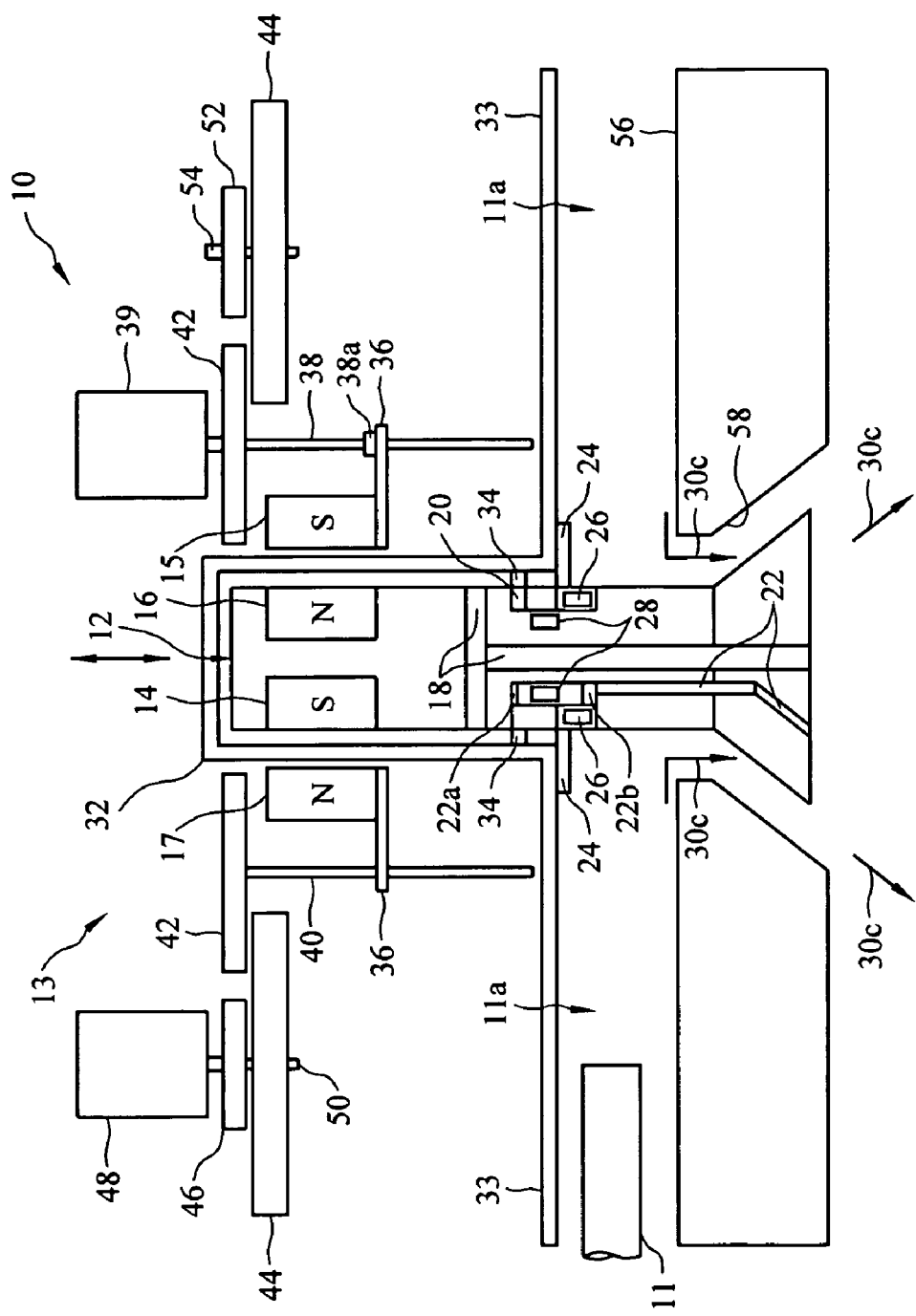
FIG. 6 is a schematic of the fluid injection apparatus, with the fluid injector in an uppermost position to block flow of fluid through both the central fluid conduit and an outer fluid conduit in the fluid injector and facilitate peripheral flow of fluid only from the apparatus.

FIG. 6 illustrates operation of the apparatus 10 wherein the fluid injector 12 is in the uppermost position inside the outer isolation cover 32. Accordingly, the first portion 30a of the fluid 30 is incapable of being ejected from the central fluid conduit 18 because the horizontal segment of the central fluid conduit 18 is located entirely inside the outer isolation cover 32. Furthermore, the floating isolation plate 24 has been urged downwardly against the bottom of the plate cavity 20, against the upward bias imparted by the magnetic attraction between the stationary magnet 28 and the floating magnet 26, such that the lower inlet 22b is blocked to prevent flow of the second portion of the fluid 30b through and discharge of the fluid 30b from the outer fluid conduit 22. However, due to the maximum width of the gap between the floating isolation plate 24 and the inner isolation plate 56, a maximal quantity of the third portion 30c of the fluid 30 flows through the peripheral fluid conduit 58 and is ejected outwardly against the surface of the wafer in an annular flow path.

Figure 7:
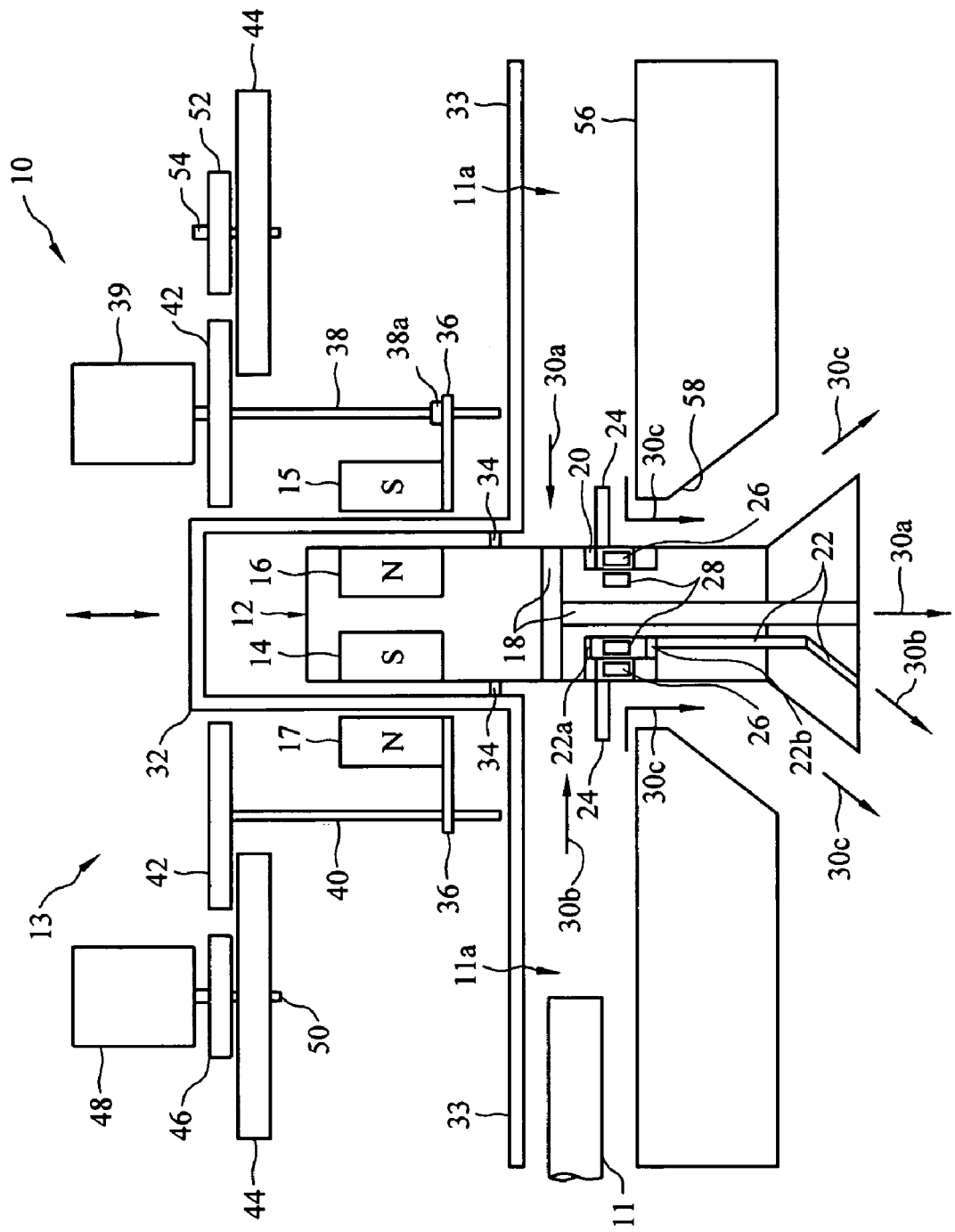
FIG. 7 is a schematic of the fluid injection apparatus, with the fluid injector positioned to provide a narrow peripheral flow of fluid from the apparatus.

FIG. 7 illustrates operation of the apparatus 10 wherein the width of the peripheral fluid conduit 58 is restricted by the close proximity of the floating isolation plate 24 to the inner isolation plate 56. Accordingly, a relatively small quantity of the third portion 30c of the fluid 30 is capable of flowing outwardly in an annular flow path against the surface of the wafer through the peripheral fluid conduit 58. The first quantity 30a of the fluid 30 flows through and is ejected from the central fluid conduit 18 directly against the surface of the wafer. The second quantity 30b of the fluid 30 flows through and is ejected outwardly from the outer fluid conduit 22 against the surface of the wafer.

Figure 8:
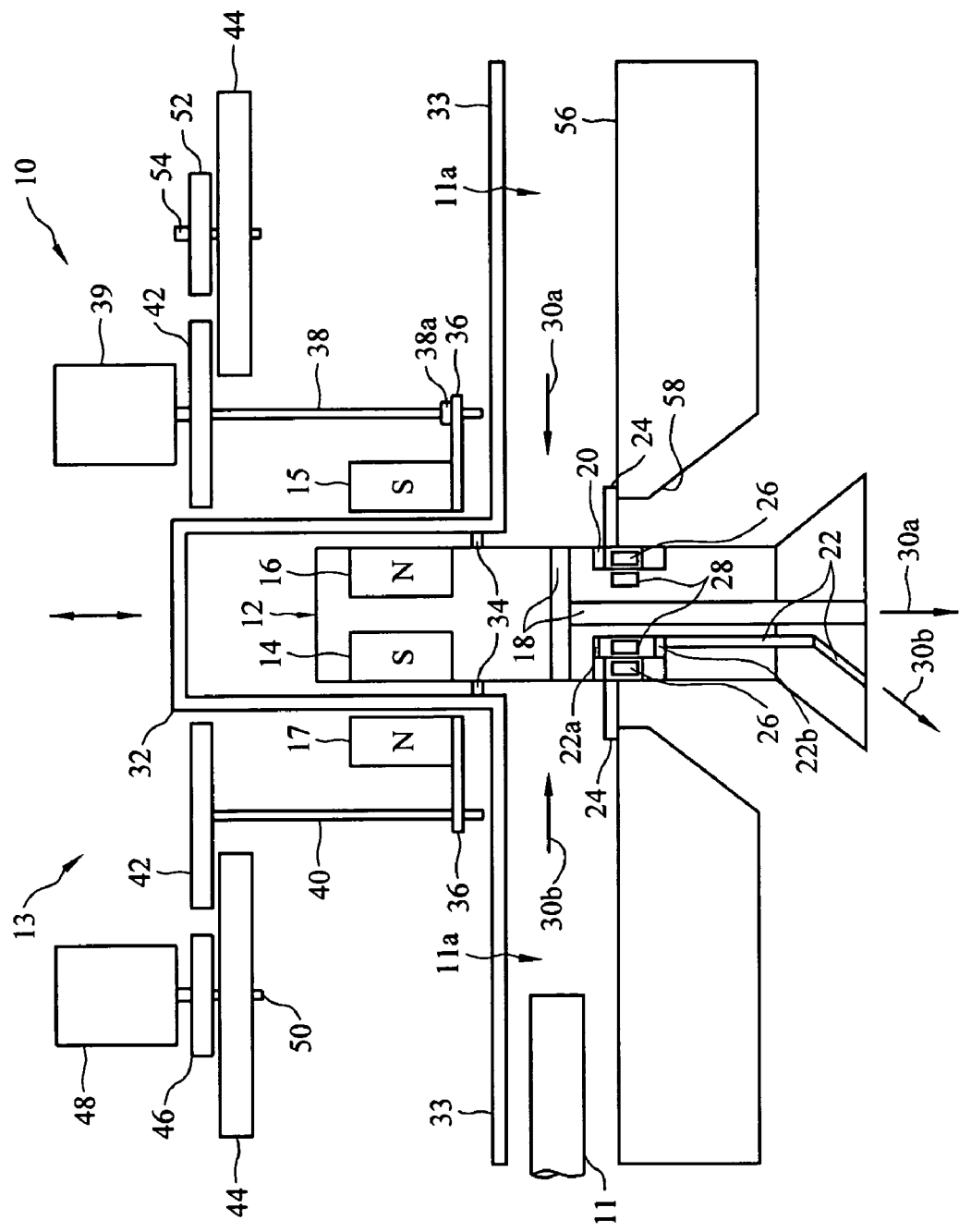
FIG. 8 is a schematic of the fluid injection apparatus, with the fluid injector positioned to block peripheral flow of fluid from the apparatus and restrict flow of fluid to the central fluid conduit and outer fluid conduit of the fluid injector only.

FIG. 8 illustrates operation of the apparatus 10 wherein the peripheral fluid conduit 58 is closed by engagement of the floating isolation plate 24 with the inner isolation plate 56. Accordingly, the third portion 30c of the fluid 30 is incapable of flowing through the peripheral fluid conduit 58 and outwardly against the surface of the wafer. The first portion 30a of the fluid 30 flows through and is discharged from the central fluid conduit 18, and the second portion 30b of the fluid 30 flows into the outer fluid conduit 22 through the plate cavity 20 and upper inlet 22a, respectively, and is discharged outwardly against the wafer from the bottom of the fluid injector 12.

Figure 9:
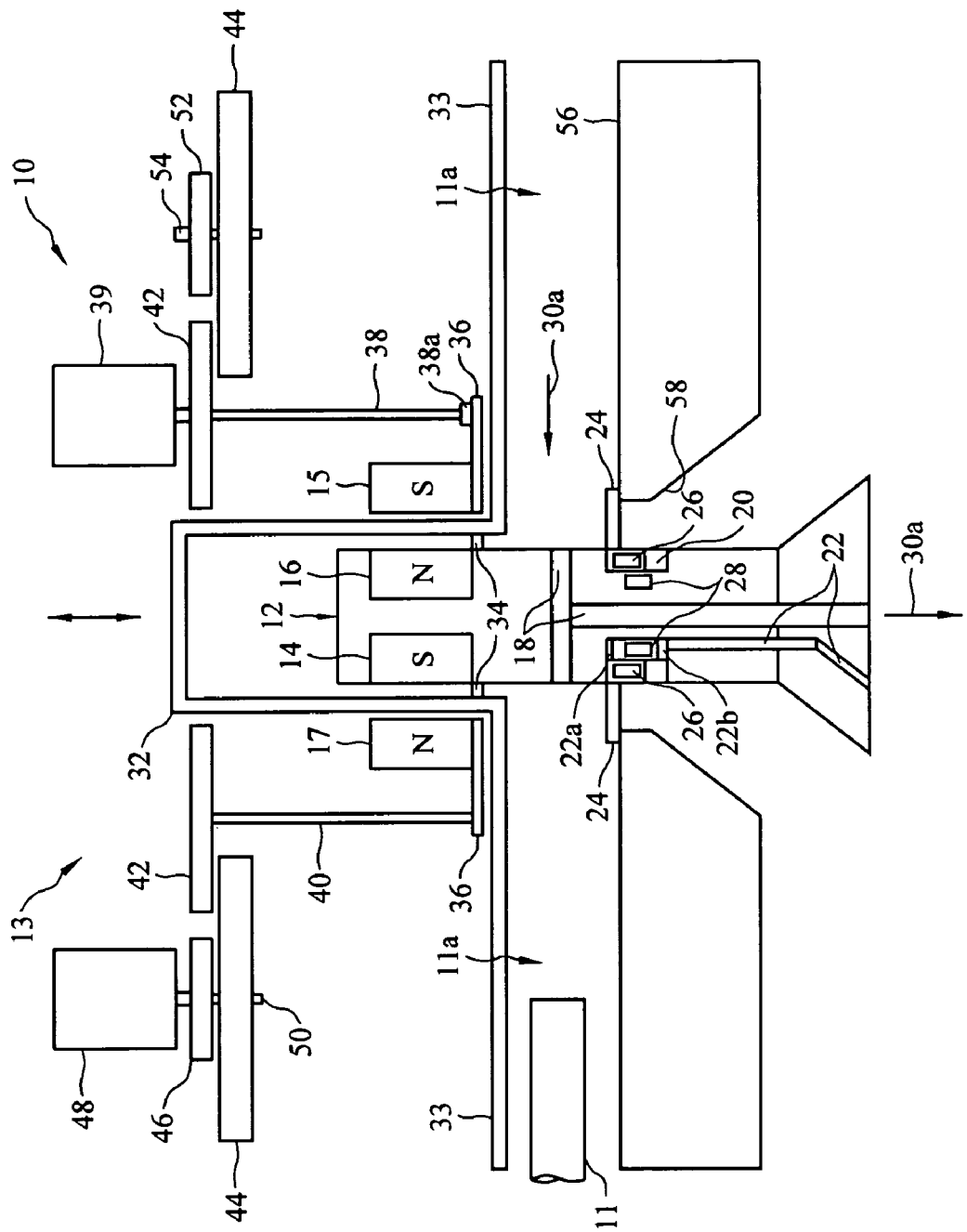
FIG. 9 is a schematic of the fluid injection apparatus, with the fluid injector in a lowermost position to block peripheral flow of fluid from the apparatus and flow of the fluid through the outer fluid conduit and restrict flow of the fluid to the central fluid conduit of the fluid injector.

FIG. 9 illustrates operation of the apparatus 10 wherein the fluid injector 12 is in the lowermost position in the outer isolation cover 32. Accordingly, the floating isolation plate 24 engages both the inner isolation plate 56 and the upper surface of the plate cavity 20. Therefore, the floating isolation plate 24 seals the upper inlet 22a and the lower inlet 22b of the outer fluid conduit 22, thereby preventing flow of the second portion 30b of the fluid 30 through the outer fluid conduit 22. The floating isolation plate 24 also seals the peripheral fluid conduit 58 of the inner isolation plate 56, thus preventing flow of the third portion 30c of the fluid 30 from the apparatus 10 against the wafer. Thus, the entire quantity of fluid 30a is restricted to flow through the central fluid conduit 18 and is directly discharged against the surface of the wafer.

While the preferred embodiments of the invention have been described above, it will be recognized and understood that various modifications can be made in the invention and the appended claims are intended to cover all such modifications which may fall within the spirit and scope of the invention.

What is claimed is:

1. A fluid injection apparatus for discharging a fluid against a surface, comprising:
   at least one fluid supply conduit;
   at least one rotatable and vertically-movable fluid injector provided in fluid communication with said at least one fluid supply conduit;
   an outer isolation cover wherein said fluid injector is provided in said outer isolation cover;
   at least two fluid conduits provided in said fluid injector;
   wherein said at least two fluid conduits are selectively blocked from said fluid supply conduit by vertical movement of said fluid injector in said outer isolation cover.

2. The fluid injection apparatus of claim 1 further comprising at least one magnetic coupling device provided in magnetic proximity to said at least one fluid injector for selective rotation and vertical movement of said at least one fluid injector.

3. The fluid injection apparatus of claim 1 further comprising a fixed isolator flange provided in said outer isolation cover and sealingly engaging said fluid injector.

4. The fluid injection apparatus of claim 1 further comprising an inner isolation plate surrounding said fluid injector.

5. The fluid injection apparatus of claim 4 further comprising a fluid flow space between said inner isolation plate and said outer isolation cover.

6. The apparatus of claim 4 wherein said inner isolation plate has a peripheral fluid conduit and wherein said fluid injector extends through said peripheral fluid conduit.

7. The fluid injection apparatus of claim 1 further comprising a floating isolation plate provided in magnetic proximity to said fluid injector and between said at least one supply conduit and said at least one fluid conduit.

8. The apparatus of claim 1 wherein said at least two fluid conduits comprises a central fluid conduit and an outer fluid conduit extending through said fluid injector.

9. A fluid injection apparatus for discharging a fluid against a surface, comprising:
   at least one fluid supply conduit;
   at least one rotatable and vertically-movable fluid injector provided in fluid communication with said at least one fluid supply conduit, wherein said fluid injector is provided in an outer isolation cover, and wherein an inner isolation plate surrounds said fluid injector;
   a fluid flow space between said inner isolation plate and said outer isolation cover;
   at least two fluid conduits provided in said fluid injector;
   wherein said at least two fluid conduits extend through said fluid injector and wherein said at least two fluid conduits are selectively blocked, from said fluid supply conduit by vertical movement of said fluid injector in said outer isolation cover.

10. The fluid injection apparatus of claim 9 further comprising at least one magnetic coupling device provided in magnetic proximity to said at least one fluid injector for selective rotation arid vertical movement of said at least one fluid injector.

11. The fluid injection apparatus of claim 9 further comprising a fixed isolator flange provided in said outer isolation cover and sealingly engaging said fluid injector.

12. The fluid injection apparatus of claim 9 further comprising a floating isolation plate provided in magnetic proximity to said fluid injector and between said at least one supply conduit and said at least one fluid conduit.

13. The apparatus of claim 9 wherein said at least two fluid conduits comprises a central fluid conduit and an outer fluid conduit extending through said fluid injector.

14. The apparatus of claim 9 wherein said inner isolation plate has a peripheral fluid conduit and wherein said fluid injector extends through said peripheral fluid conduit.

15. A fluid injection apparatus for discharging a fluid against a surface, comprising:
   at least one fluid supply conduit;
   at least one rotatable and vertically-movable fluid injector provided in fluid communication with said at least one fluid supply conduit;
   at least one fluid conduit provided in said fluid injector; and,
   a floating isolation plate provided in magnetic proximity to said fluid injector and between said at least one supply conduit and said at least one fluid conduit.

16. The fluid injection apparatus of claim 15 further comprising at least one magnetic coupling device provided in magnetic proximity to said at least one fluid injector for selective rotation and vertical movement of said at least one fluid injector.

17. The fluid injection apparatus of claim 15 further comprising a fixed isolator flange provided in an outer isolation cover and sealingly engaging said fluid injector.

18. The fluid injection apparatus of claim 15 further comprising an inner isolation plate surrounding said fluid injector.

19. The apparatus of claim 18 wherein said inner isolation plate has a peripheral fluid conduit and wherein said fluid injector extends through said peripheral fluid conduit.

20. The fluid injection apparatus of claim 18 further comprising a fluid flow space between said inner isolation plate and said outer isolation cover.

21. The fluid injection apparatus of claim 15 wherein said at least one fluid conduit comprises at least two fluid conduits extending through said fluid injector and wherein said at least two fluid conduits are selectively blocked from said fluid supply conduit by vertical movement of said fluid injector in an outer isolation cover.

22. The apparatus of claim 15 wherein said at least two fluid conduits comprises a central fluid conduit and an outer fluid conduit extending through said fluid injector.

* * * * *